(12) United States Patent
Higashi (10) Patent No.: US 7,812,363 B2
(45) Date of Patent: Oct. 12, 2010

(54) LIGHT EMITTING DEVICE MODULE

(75) Inventor: Yuji Higashi, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 330 days.

(21) Appl. No.: 12/126,508

(22) Filed: May 23, 2008

(65) Prior Publication Data

US 2008/0291688 A1 Nov. 27, 2008

(30) Foreign Application Priority Data

May 24, 2007 (JP) ............................. 2007-137492

(51) Int. Cl.
*H01L 33/00* (2010.01)
(52) U.S. Cl. .................. 257/98; 257/99; 257/E33.066; 32/545
(58) Field of Classification Search .................. 257/88, 257/99, E33.066, E33.075, 79, 81, 98, 100; 362/516, 545; 438/22, 26, 98; 361/84
See application file for complete search history.

(56) References Cited

FOREIGN PATENT DOCUMENTS

| JP | 2005-209538 A | 8/2005 |
|---|---|---|
| JP | 2006-114820 A | 4/2008 |

*Primary Examiner*—Roy K Potter
(74) *Attorney, Agent, or Firm*—Sughrue Mion, PLLC (57) ABSTRACT

A light emitting device module is provided. The light emitting device module includes a plurality of light emitting devices; a submount on which the light emitting devices are mounted; and a heat-radiant substrate to which the submount is fixed. The submount includes a positive front surface electrode; a negative front surface electrode; at least one relay front surface electrode, wherein the plurality of light emitting devices are electrically coupled to each other in series via the at least one relay front surface electrode; a plurality of through electrodes; a positive back surface electrode coupled to the positive front surface electrode via a through electrode; a negative back surface electrode coupled to the negative front surface electrode via a through electrode; and at least one relay back surface electrode which is coupled to the at least one relay front surface electrode via a through electrode. The heat-radiant substrate includes a positive circuit electrode bonded to the positive back surface electrode; a negative circuit electrode bonded to the negative back surface electrode; and at least one relay circuit electrode bonded to the at least one relay back surface electrode and being floated electrically.

13 Claims, 8 Drawing Sheets

LIGHT EMITTING DEVICE MODULE

This application claims priority from Japanese Patent Application No. 2007-137492, filed on Mar. 24, 2007, the entire contents of which are hereby incorporated by reference.

BACKGROUND

1. Technical Field

Apparatuses and devices consistent with the present invention relate to a light emitting device module having a semiconductor light emitting device such as a light emitting diode (LED) and, more particularly, to a light emitting device module for improving heat radiation performance of the light emitting device.

2. Related Art

Recently, a lamp using a light emitting device such as an LED as a light source of the lamp instead of an incandescent lamp or a discharge bulb has been proposed. Previously, an LED has been applied to vehicle tail lamps and the turn signal lamps up to now. However, with the development of a white LED with a high intensity in recent years, the LED has been proposed as a light source for a vehicle headlamp. In this case, the LED generates heat accompanying the light emission, and thus the LED causes thermal runaway due to this heat, and the light emission characteristic is degraded. In particular, it is advantageous to select an LED with a high luminous intensity as the lamp for the vehicle, and the amount of heat generated by the LED is extremely large.

Japanese Patent Application Publication No. 2005-209538 describes an LED module having such a structure that a chip-shaped LED is mounted on a submount. The LED is covered with a dome-like lens, and the submount is mounted on a heat radiating plate to constitute the light source. The heat generated in the LED module is radiated via the heat radiating plate to prevent a temperature rise of the LED. However, since the submount is formed of a high-resistive insulating material in this structure, it becomes difficult to transfer the heat generated by the LED to the submount and also to transfer the heat from the submount to the heat radiating plate.

Figure 9:
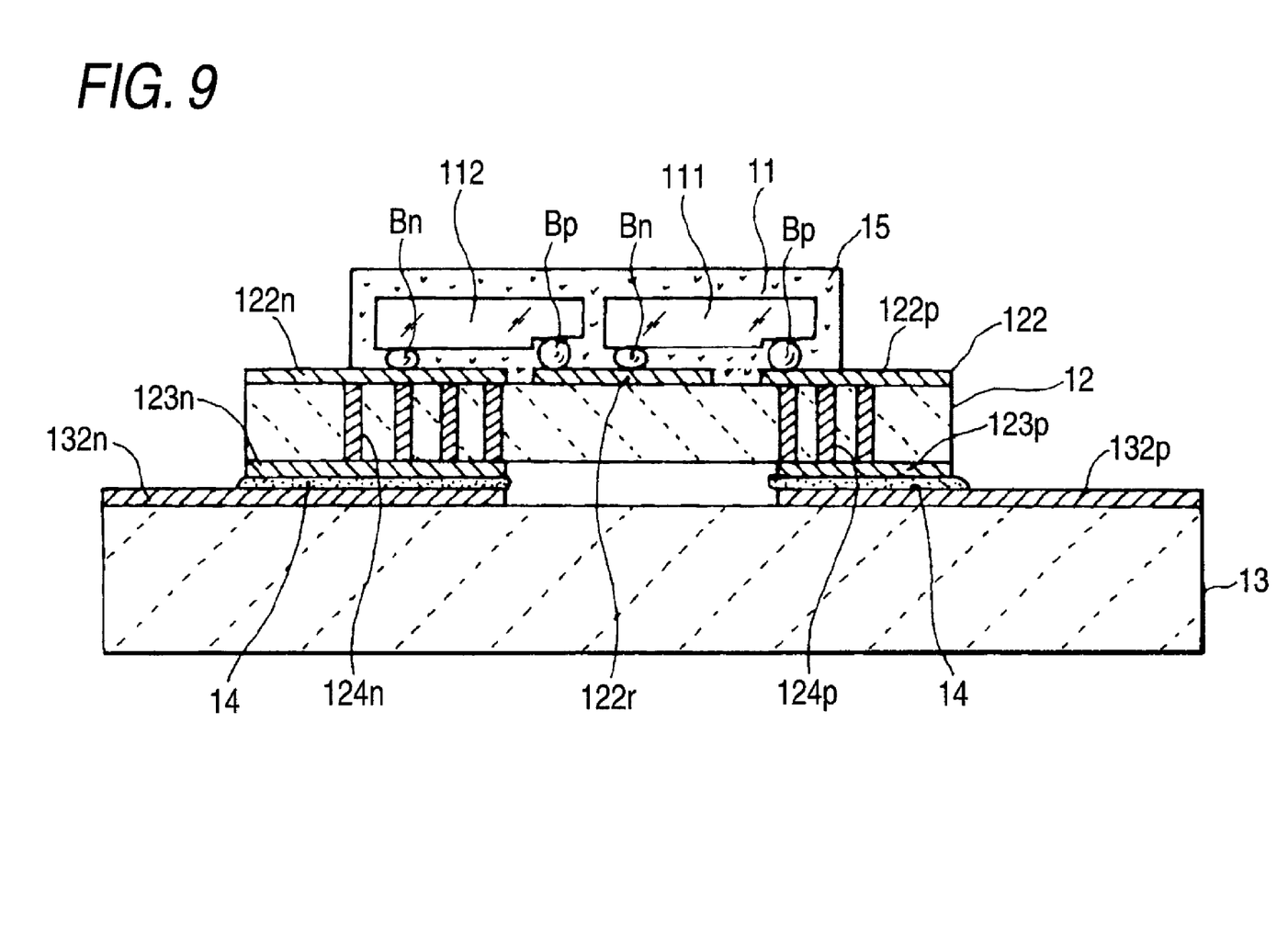
FIG. 9 is a sectional view of a related art LED module.

Japanese Patent Application Publication No. 2006-114820 describes another related art LED module. As shown in FIG. 9, in the related art LED module, a first LED 111 and a second LED 112 are connected electrically in series, and a plurality of front surface electrodes 122 (122p, 122r, 122n) used to mount the LED are formed on a submount 12 made of the high resistive member. In other words, a positive surface electrode 122p and a negative surface electrode 122n, which are used to feed an electric power from the outside and a relay surface electrode 122r, which is used to connect the first and second LEDs 111, 112 in series, are formed. A plurality of back surface electrodes 123 comprising a positive back surface electrode 123p and a negative back surface electrode 123n, which are connected electrically to the positive surface electrode 122p and the negative surface electrode 122n via through electrodes 124 (124p, 124n) respectively, are formed on a back surface of the submount 12. Also, in the structure in FIG. 9, a high heat-radiant substrate 13 made of a high heat-radiant member on which the submount 12 is mounted and which has a high heat radiating property is provided. A positive circuit electrode 132p and a negative circuit electrode 132n, which are connected electrically to the positive back surface electrode 123p and the negative back surface electrode 123n on the submount 12 respectively, are formed on a surface of the high heat-radiant substrate 13. Then, the LEDs 111, 112 are mounted on respective surface electrodes 122p, 122r, 122n of the submount 12 via bump electrodes Bp, Bn, and these LEDs are sealed with a translucent resin 15. The back surface electrodes 123p, 123n are bonded to the circuit electrodes 132p, 132n of the high heat-radiant substrate 13 by a metal brazing material 14 respectively. In this LED module, although not shown, the LED light source is constructed by securing a dome-like lens to the surface of the high heat-radiant substrate 13 to cover the LEDs 111, 112 in such a manner that the light generated by the LEDs 111, 112 is converged and emitted.

Then, the back surface of the high heat-radiant substrate 13 of the related art LED module is mounted on the heat radiating plate made of a metal, or the like. Therefore, the heat generated by the LEDs 111, 112 is transferred to the back surface electrode 123 from the surface electrodes 122 of the submount 12 via the through electrodes 124, then to the circuit electrodes 132 of the high heat-radiant substrate 13 from the back surface electrode 123. The heat is then spread to the overall high heat-radiant substrate 13 and transferred to the heat radiating plate. As a result, an improvement in the effect of heat radiation can be expected.

However, the related art LED module shown in FIG. 9 has some disadvantages. Since the relay surface electrode 122r, which is used to connect the first and second LEDs 111, 112 in series, out of the surface electrodes 122 of the submount 12 need not be connected electrically to the circuit electrodes 132 of the high heat-radiant substrate 13, the through electrodes 124 and the back surface electrode 123 are not formed in and on the relay surface electrode 122r. However, a part of heat generated by the first and second LEDs 111, 112 is transferred to the relay surface electrode 122r. Thus, in the related art LED module, this part of the heat is not transferred to the back surface side of the submount 12. Accordingly, the heat transfer to the high heat-radiant substrate 13 from the relay surface electrode 122r and, consequently, the heat radiated from the relay surface electrode 122r are very small. Therefore, it is difficult to transmit the heat generated by the LEDs to the high heat-radiant substrate at a high efficiency, and as a result the heat radiated is reduced, and it is difficult to improve the heat radiation. As an alternative, the respective areas of the submount and the high heat-radiant substrate may be increased in size in order to increase the amount of heat radiated. However, this increase in size also increases the overall size of the LED module. Thus, it is difficult to implement a small-sized light source or a small-sized vehicle lamp.

SUMMARY

Exemplary embodiments of the present invention address the above disadvantages and other disadvantages not described above. However, the present invention is not required to overcome the disadvantages described above, and thus, an exemplary embodiment of the present invention may not overcome any of the problems described above.

It is an aspect of the present invention to provide a light emitting device module, which includes a light emitting device, whose heat radiation effect is improved without increasing the size of the light emitting device module.

According to an exemplary embodiment of the present invention, there is provided a light emitting device module. The light emitting device module includes: a plurality of light emitting devices; a submount on which the plurality of light emitting devices are mounted; and a heat-radiant substrate to which the submount is supported and fixed. The submount includes: a positive front surface electrode; a negative front surface electrode; at least one relay front surface electrode, wherein the plurality of light emitting devices are electrically coupled to each other in series between the positive front surface electrode and the negative front surface electrode via the at least one relay front surface electrode; a plurality of through electrodes; a positive back surface electrode coupled to the positive front surface electrode via a through electrode of the plurality of through electrodes; a negative back surface electrode coupled to the negative front surface electrode via a through electrode of the plurality of through electrodes; and at least one relay back surface electrode, which corresponds to the at least one relay front surface electrode and which is coupled to the at least one relay front surface electrode via a through electrode of the plurality of through electrodes. The heat-radiant substrate includes: a positive circuit electrode bonded to the positive back surface electrode; a negative circuit electrode bonded to the negative back surface electrode; and at least one relay circuit electrode bonded to the at least one relay back surface electrode and being floated electrically.

According to another exemplary embodiment of the present invention, there is provided a light emitting device module which includes two light emitting devices; a submount on which the two light emitting devices are mounted; and a heat-radiant substrate to which the submount is supported and fixed. The submount comprises two front surface electrodes; a relay front surface electrode, wherein the light emitting devices are electrically coupled to each other in series between the two front surface electrodes via the relay front surface electrode; a plurality of through electrodes; two back surface electrodes, which correspond to the two front surface electrodes, the back surface electrodes being coupled to the respective front surface electrodes by the plurality of through electrodes; and a relay back surface electrode, which corresponds to the relay front surface electrode and which is coupled to the relay front surface electrode via the plurality of through electrodes. The heat-radiant substrate comprises two circuit electrodes bonded to the two back surface electrodes, respectively; and a relay circuit electrode bonded to the relay back surface electrode.

According to another exemplary embodiment of the present invention, there is provided a vehicle headlamp including the light emitting device module.

DETAILED DESCRIPTION OF EXEMPLARY EMBODIMENTS OF THE PRESENT INVENTION

First Exemplary Embodiment

Figure 1:
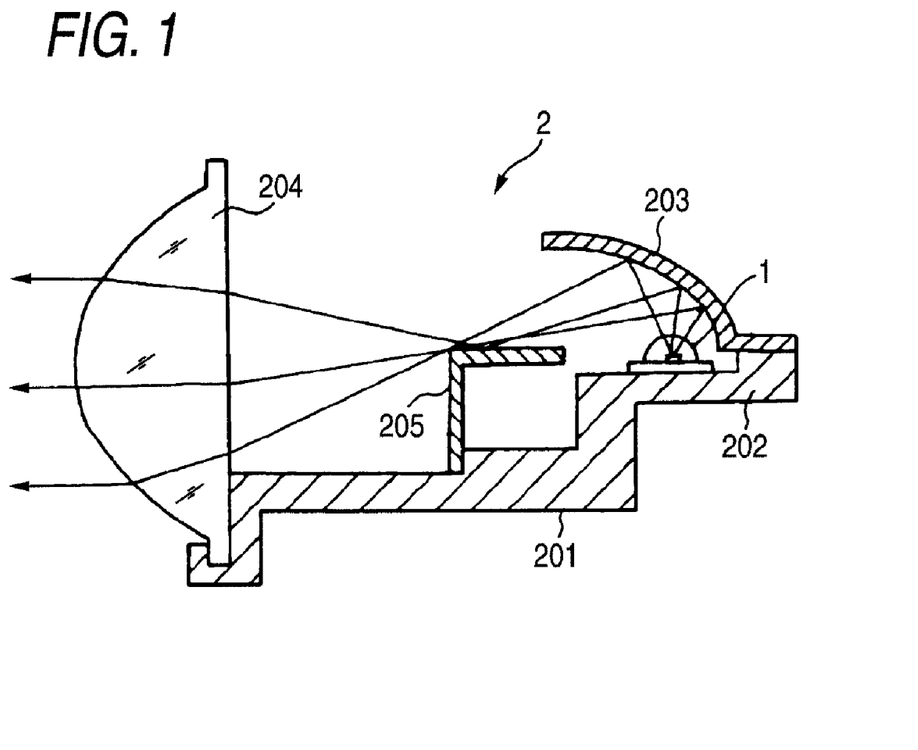
FIG. 1 is a schematic sectional view of an LED lamp according to an exemplary embodiment of the present invention.

A first exemplary embodiment will now be described with reference to FIGS. 1-5, in which a light emitting device module is applied to an LED module used as a light source. It should be noted that the light emitting device module according to exemplary embodiments of the present invention often find application in a headlamp of a car. However, the present invention is not limited to this application. Rather, the present inventive concept applies equally to any vehicle headlamp, and to any light emitting device module which has a relatively high luminous intensity and for which it is advantageous to increase the efficiency of heat radiation. FIG. 1 is a schematic sectional view of an LED lamp 2. The LED lamp 2 comprises a base member 201 formed integrally with a heat sink 202, a reflector 203 supported by the heat sink 202 and having a reflecting surface that is curved upwardly like an ellipsoid of revolution, an LED light source 1 mounted on a part of an upper surface of the heat sink 202 corresponding to a focal position of the reflector 203, and a lens 204 and a shade 205 supported on the base member 201 in respective front positions of the reflector 203. Although not shown, the base member 201 is fixed in a lamp body of a headlamp. A light emitted by the LED light source 1 is reflected by the reflecting surface of the reflector 203 and is converged on a second focal position, and then the converged light is screened by the shade 205 and is incident on the lens 204, so that a luminous flux converged by the lens 204 is irradiated forward.

Figure 2:
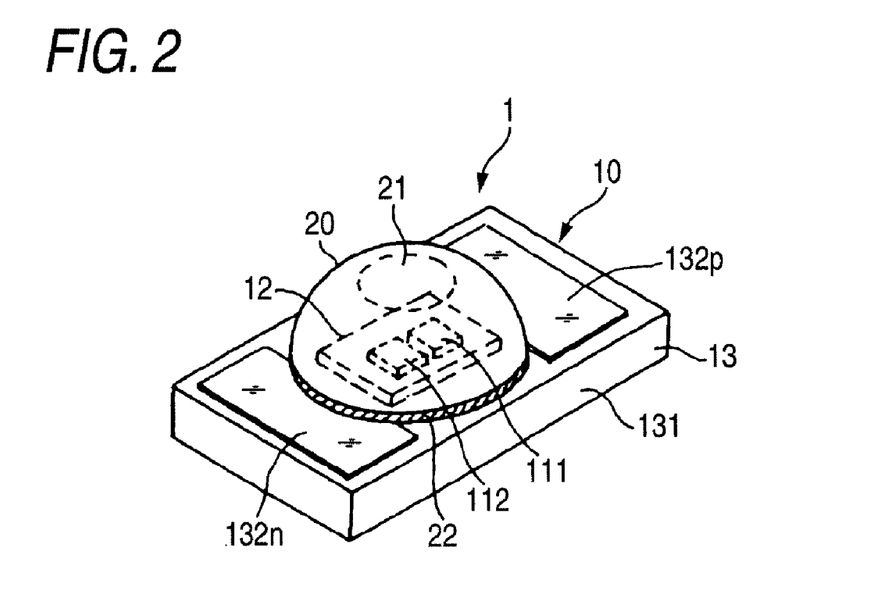
FIG. 2 is a schematic perspective view of an LED light source according to a first exemplary embodiment of the present invention.
Figure 3:
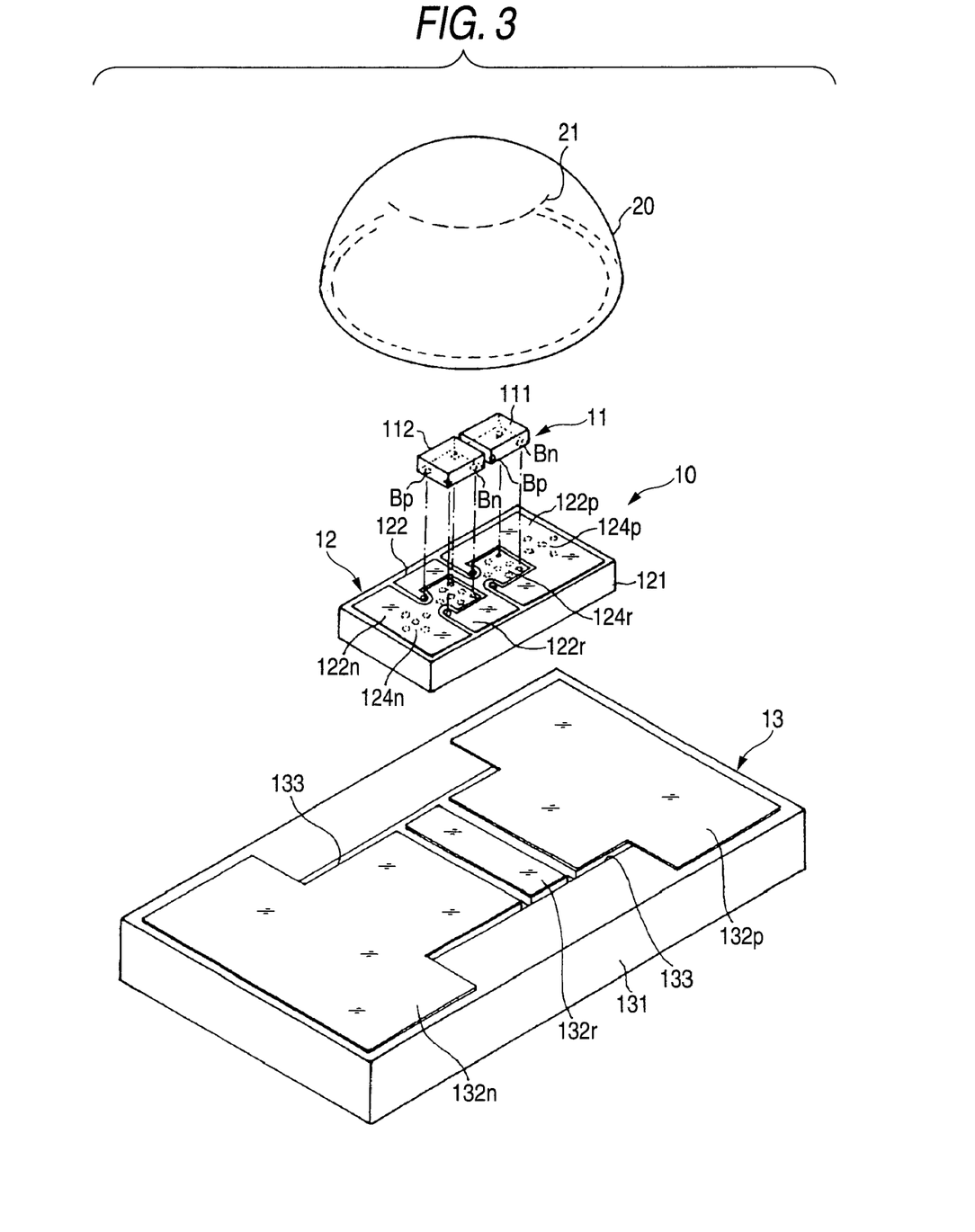
FIG. 3 is a partially exploded perspective view of the LED light source in FIG. 2.

As shown in an external view in FIG. 2, the LED light source 1 comprises an LED module 10, and a miniature lens 20 fixed to the LED module 10. FIG. 3 is a partially exploded perspective view of the LED light source 1 of FIG. 2. The LED module 10 comprises an LED 11, a submount 12 and a high heat-radiant substrate 13. A plurality of chip-shaped LEDs, i.e., first and second chip-shaped LEDs 111, 112, are mounted on the surface of the submount 12. When electric power is supplied to the chip-shaped LEDs 111, 112, the chip-shaped LEDs 111, 112 emit light and the light is emergent from upper surfaces of respective LEDs substantially vertically upward. The submount 12 is bonded to the upper surface of the high heat-radiant substrate 13, and the back surface of the high heat-radiant substrate 13 is fixed to the upper surface of the heat sink 202 of the LED lamp 2, as shown in FIG. 1. Also, a plurality of circuit electrodes 132 (i.e., 132n, 132p, 132r) that are shaped into given planar patterns, as described later, respectively are provided on the surface of the high heat-radiant substrate 13. An external electric power for causing the LEDs 111, 112 to emit the light is fed through the circuit electrodes 132n and 132p.

Figure 4A:
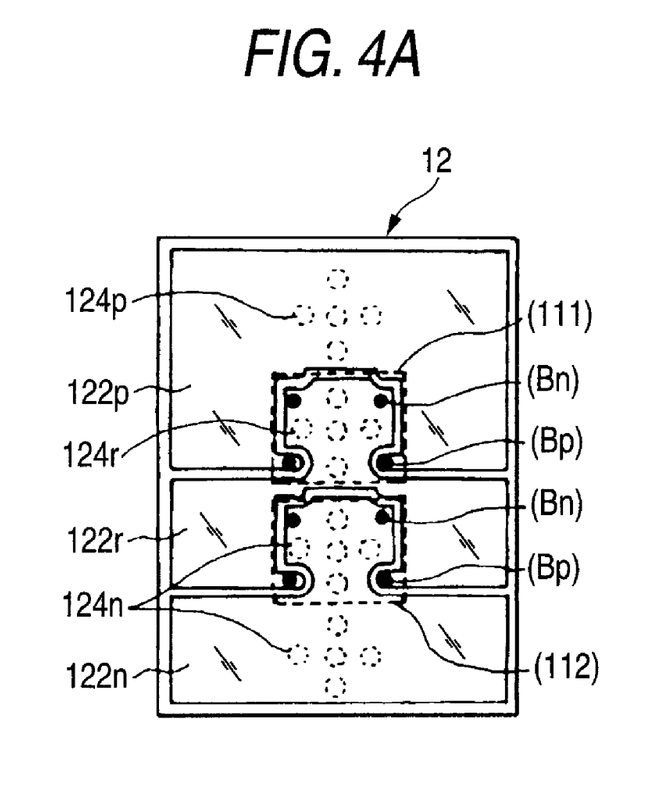
FIGS. 4A and 4B are a front surface view and a back surface view, respectively, of a submount of the LED light source in FIG. 3.
Figure 4B:
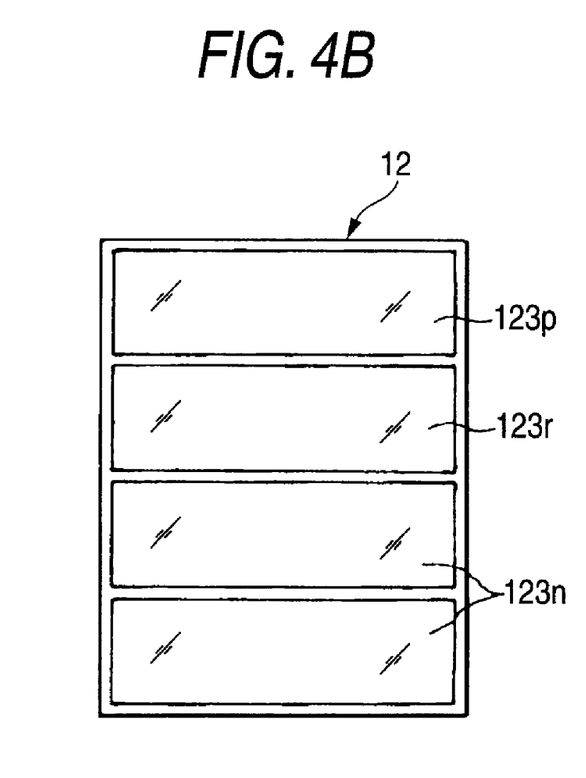

FIGS. 4A and 4B are a front surface view and a back surface view, respectively, of the submount 12 of the LED module 10. The submount 12 comprises a high-resistive substrate 121 (see FIG. 3) such as silicon into which an impurity is not doped, or the like. An insulating film (not shown) made of a silicon oxide film, or the like, is formed on the front surface and the back surface of the submount 12. A plurality of front surface electrodes 122 made of a metal thin film that is shaped into a given pattern are formed on the silicon oxide film on the surface of the submount 12. Here, the positive surface electrode 122p which is arranged on one end side of the submount 12 and to which a positive electrode of the first LED 111 is connected, the relay surface electrode 122r which is arranged adjacent to this electrode and to which a negative electrode of the first LED 111 and a positive electrode of the second LED 112 are connected respectively, and the negative surface electrode 122*n* which is arranged on the other end side of the submount 12 from the positive surface electrode 122*p* and to which a negative electrode of the second LED 112 is connected are formed. The patterns of the front surface electrodes 122 are shaped such that a part the negative surface electrode 122*n* protrudes into the relay surface electrode 122*r*, and a part of the relay surface electrode 122*r* protrudes into the positive surface electrode 122*p*. The parts of the relay surface electrode 122*r* and the negative surface electrode 122*n* that protrude into their respective neighboring electrodes are rectangular in shape, and the protruded portions are thus inserted partially into their respective neighboring electrodes.

Also, the back surface electrodes 123 formed of a metal thin film that is shaped into a given pattern respectively are formed on the silicon oxide film on the back surface. The back surface electrodes 123 comprises back surface electrodes 123*p*, 123*r*, 123*n* such that the back surface electrodes 123 correspond to the front surface electrodes 122 in equal number. The back surface electrodes 123*p*, 123*r*, 123*n* are arranged to oppose the front surface electrodes 122*p*, 112*r*, 122*n* on a one-to-one basis. The front surface electrodes and the back surface electrodes arranged to oppose to each other are coupled together electrically using through electrodes 124 (124*p*, 124*r*, 124*n*), respectively, formed to pass through the submount in the thickness direction. Accordingly, the back surface electrode coupled electrically to the positive front surface electrode 122*p* via the through electrode 124*p* is the positive back surface electrode 123*p*, and the back surface electrode coupled electrically to the negative front surface electrode 122*n* via the through electrode 124*n* is the negative back surface electrode 123*n*. Also, the back surface electrode coupled electrically to the relay front surface electrode 122*r* via the through electrode 124*r* is the relay back surface electrode 123*r*.

Figure 5:
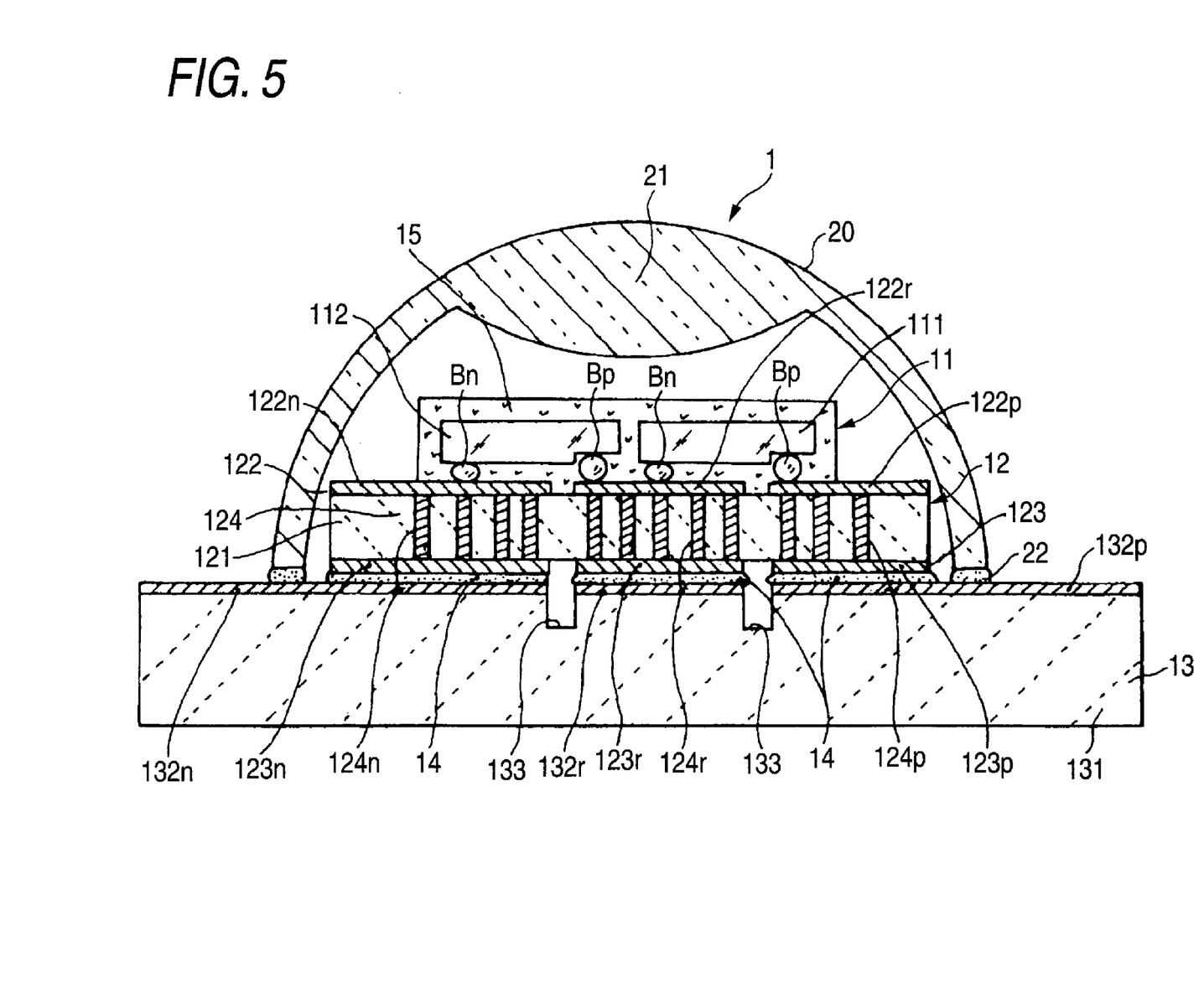
FIG. 5 is a sectional view of the LED light source in FIG. 2.

FIG. 5 is a sectional view describing a conceptual configuration of the LED light source 10, from which detailed description of the through electrodes 124*p*, 124*r*, 124*n* is omitted. A metal film is formed on inner surfaces of through holes that are passed through the high resistive substrate 121 in the thickness direction. Alternatively, a metal member may be buried inside of the through holes. I.e., alternatively, the through holes may be filled with metal material. In the first exemplary embodiment, the front surface electrodes 122 and the back surface electrodes 123 are formed of a stacked metal film comprising a gold film and another metal film, and the through electrodes 124 are made of a metal with a good heat conductivity, e.g., copper, and are constructed by filling copper or a copper thin film in the through holes.

The first LED 111 and the second LED 112 each comprise a plate-like chip whose planar shape is similar to a square, and the bump electrodes Bp, Bn are formed at four corners of the back surface respectively of the chip. Out of the four bump electrodes Bp, Bn, two bump electrodes on one end sides of the LEDs 111, 112 are positive bump electrode Bp, and two bump electrodes on the other end sides are negative bump electrode Bn. Then, the first and second LEDs 111, 112 are positioned on the surface electrodes 122*p*, 122*r* of the submount 12, as indicated by a broken line in FIG. 4A, and then are mounted on the submount 12 by coupling electrically the bump electrodes Bp, Bn of the LEDs 111, 112 to the surface electrodes 122*p*, 122*r*, 122*n* by means of thermo compression bonding. In the first LED 111, two positive bump electrodes Bp and two negative bump electrodes Bn are coupled to the positive surface electrode 122*p* and the relay surface electrode 122*r* respectively. In the second LED 112, two positive bump electrodes Bp and two negative bump electrodes Bn are coupled to the relay surface electrode 122*r* and the negative surface electrode 122*n* respectively. As a result, the first and second LEDs 111, 112 are coupled electrically in series between the positive surface electrode 122*p* and the negative surface electrode 122*n* via the relay surface electrode 122*r*.

As shown in FIG. 3, the high heat-radiant substrate 13 comprises a plate member 131 such as an aluminum nitride, or the like, whose heat conductivity is good, and the circuit electrodes 132 made of a stacked metal film comprising a gold film and another metal film and shaped into given patterns are formed on the surface of the high heat-radiant substrate 13. The circuit electrodes 132 are formed as a plurality of circuit electrodes 132*p*, 132*r*, 132*n* to oppose to the back surface electrodes 123 of the submount 12. Out of the circuit electrodes 132*p*, 132*r*, 132*n*, the circuit electrode opposing the positive back surface electrode 123*p* of the submount 12 is a positive circuit electrode 132*p*, the circuit electrode opposing the negative back surface electrode 123*n* is a negative circuit electrode 132*n*, and the circuit electrode opposing the relay back surface electrode 123*r* is a relay circuit electrode 132*r*. Here, wirings that are coupled to an external power source when the high heat-radiant substrate 13 is fixed to the heat sink 202 of the LED lamp 2 are coupled electrically to the positive and negative circuit electrodes 132*p*, 132*n*. But no wiring is coupled to the relay circuit electrode 132*r*. Rather, the relay circuit electrode 132*r* is kept electrically in a floating state. In other words, the relay circuit electrode 132*r* is a dummy circuit electrode. Also, recesses 133 that have a depth equal to or greater than a thickness of the circuit electrodes 132 are formed in areas that are extended along respective boundaries between the positive circuit electrode 132*p*, the relay back surface electrode 123*r*, and the negative circuit electrode 132*n* on the surface of the high heat-radiant substrate 13. Thus, respective circuit electrodes 132*p*, 132*r*, 132*n* are isolated electrically and mechanically by the recesses 133.

The submount 12 is arranged on the surface of the high heat-radiant substrate 13, and then the back surface electrodes 123 are bonded to the circuit electrodes 132 by a brazing material 14 such as a gold/tin eutectic alloy, or the like. FIG. 5 is a sectional view of the LED light source in which alignments of the bump electrodes Bp, Bn of the LEDs 111, 112, the front surface electrodes 122, the back surface electrodes 123, and the through electrodes 124 are changed partially, to facilitate illustration. The positive back surface electrode 123*p* is bonded to the positive circuit electrode 132*p*, the negative back surface electrode 123*n* is bonded to the negative circuit electrode 132*n*, and the relay back surface electrode 123*r* is bonded to the relay circuit electrode 132*r* as the dummy circuit electrode. At this time, the brazing material 14, which is fused at respective circuit electrodes 132 and oozes out toward their peripheries, flows into the recesses 133 provided on the surface of the high heat-radiant substrate 13. Therefore, the ooze of the brazing material 14 to the neighboring circuit electrodes 132 can be prevented, and thereby the neighboring circuit electrodes 132 are prevented from being short-circuited electrically by the brazing material 14. Accordingly, an external electric power can be supplied to the positive back surface electrode 123*p* and the negative back surface electrode 123*n* of the submount 12 via the positive circuit electrode 132*p* and the negative circuit electrode 132*n* of the high heat-radiant substrate 13. Then, this electric power can be supplied to the positive surface electrode 122*p* and the negative surface electrode 122*n* via the through electrodes 124*p*, 124*n* respectively, and then the electric power can be supplied to the first and second LEDs 111, 112 that are coupled together in series. Also, since a clearance between the back surface electrodes 123 and the circuit electrodes 132 is eliminated by the brazing material 14, a resistance of the electrical connection between both electrodes can be reduced and a heat conductivity between both electrodes can be improved.

In the first exemplary embodiment, as shown in FIG. 5, the LEDs 111, 112 are sealed with a translucent resin 15 for transmitting light. A fluorescent substance for converting a wavelength of the light emitted from the LEDs 111, 112 may be mixed into the translucent resin 15. Thus, the light transmitted through the translucent resin 15 and emerging from the LED light source 1 may have a color which is different from that of the light from the LEDs 111, 112. For example, the blue light emitted from the LEDs can be converted to the white light. Also, the miniature lens 20 shaped like a semicircle dome and formed of a transparent resin is put on the LED module 10 to cover integrally the LEDs 111, 112, and is adhered to the surface of the high heat-radiant substrate 13 at the peripheral portion by an adhesive 22. A top portion of the miniature lens 20 is formed as a biconvex lens 21, and is arranged in a position just above the first and second LEDs 111, 112. As shown in FIG. 1, the LED light source 1 constructed in this manner is disposed on the upper surface of the heat sink 202 of the LED lamp 2, and is fixed by screws, clips, or the like (not shown) in a state that the back surface of the high heat-radiant substrate 13 contacts the upper surface of the heat sink 202. Also, a positive power source wiring and a negative power source wiring extended from a lighting circuit (not shown) are coupled to the positive circuit electrode 132$p$ and the negative circuit electrode 132$n$ formed on the surface of the high heat-radiant substrate 13 respectively, and an electric power is supplied to these circuit electrodes.

In the LED lamp 2 having such LED light source 1, when an electric power is supplied to the positive circuit electrode 132$p$ and the negative circuit electrode 132$n$ of the high heat-radiant substrate 13, the electric power is fed to the positive back surface electrode 123$p$ and the negative back surface electrode 123$n$ of the submount 12, and then the electric power is fed to the positive surface electrode 122$p$ and the negative surface electrode 122$n$ via the through electrodes 124$p$, 124$n$ respectively. Thus, an electric power is supplied to the first and second LEDs 111, 112 that are coupled in series via the relay surface electrode 122$r$, and then the first and second LEDs 111, 112 emit the light. The emitted light is emergent to the upper area of the LEDs 111, 112, then is converged by the miniature lens 20 and then is emergent upwardly. As shown in FIG. 1, the emergent light is reflected and converged by the reflector 203, a part of luminous flux is restricted by the shade 205, and the unrestricted luminous flux is transmitted through the lens 204 and is illuminated to have a given light distribution characteristic.

The first and second LEDs 111, 112 generate heat respectively in emitting light. A part of the heat is transferred to the positive surface electrode 122$p$ and the negative surface electrode 122$n$ of the submount 12, and then is transferred to the positive back surface electrode 123$p$ and the negative back surface electrode 123$n$ via the through electrodes 124$p$, 124$n$ respectively. Then, the heat is transferred from the positive back surface electrode 123$p$ and the negative back surface electrode 123$n$ to the positive circuit electrode 132$p$ and the negative circuit electrode 132$n$, which are bonded to the electrodes 123$p$, 123$n$ by the brazing material 14 respectively, of the high heat-radiant substrate 13 respectively. Therefore, the heat is transferred to the whole plate member 131 of the high heat-radiant substrate 13, particularly to the back surface of the high heat-radiant substrate 13, and thus the heat is transferred to the heat sink 202 contacting the high heat-radiant substrate 13, and radiated from the high heat-radiant substrate 13. At the same time, another part of the heat generated by the LEDs 111, 112 is transferred to the relay surface electrode 122$r$ of the submount 12, then is transferred to the relay back surface electrode 123$r$ via the through electrode 124$r$, and then is transferred to the dummy circuit electrode (the relay circuit electrode) 132$r$ of the high heat-radiant substrate 13 that is bonded to this surface electrode 123$r$ by the brazing material 14. Accordingly, the heat is transferred from the dummy circuit electrode 132$r$ to the back surface of the high heat-radiant substrate 13, and is radiated from the heat sink 202.

In this manner, in the first exemplary embodiment, the relay back surface electrode 123$r$ is coupled to the relay surface electrode 122$r$, which is used to couple in series the first and second LEDs 111, 112, via the through electrode 124$r$, and also the dummy circuit electrode 132$r$ that is floated electrically is provided to the high heat-radiant substrate 13 and bonded to the relay back surface electrode 123$r$. Therefore, the heat generated by the LEDs 111, 112 and transferred to the relay surface electrode 122$r$ can be transferred at a high efficiency to the high heat-radiant substrate 13 via the relay back surface electrode 123$r$ and the dummy circuit electrode 132$r$, and also the effect of heat radiation via the high heat-radiant substrate 13 or the heat sink 202 can enhanced. Accordingly, because the heat that is transferred to the relay surface electrode 122$r$ of the submount 12 is radiated via the relay back surface electrode 123$r$ and the dummy circuit electrode 132$r$, the heat radiation can be improved over that of the related art LED module shown in FIG. 9. Since the dummy circuit electrode 132$r$ is floated electrically, the relay back surface electrode 123$r$ and the relay surface electrode 122$r$ of the submount 12 being coupled to this dummy circuit electrode 132$r$ are also floated electrically, and thus the series connection of the LEDs 111, 112 is never affected.

Second Exemplary Embodiment

Figure 6:
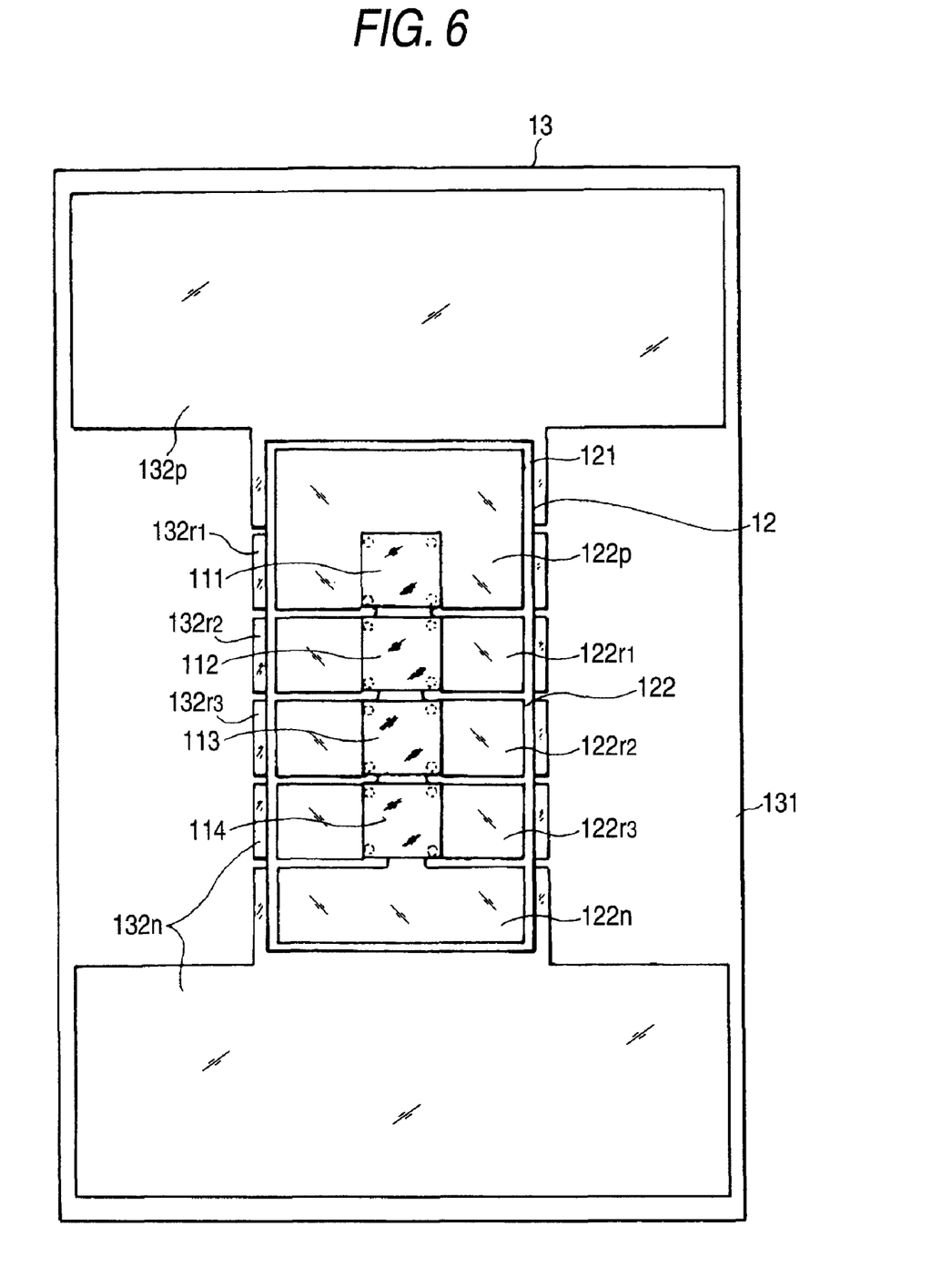
FIG. 6 is a plan view of an LED module according to a second exemplary embodiment of the present invention.
Figure 7:
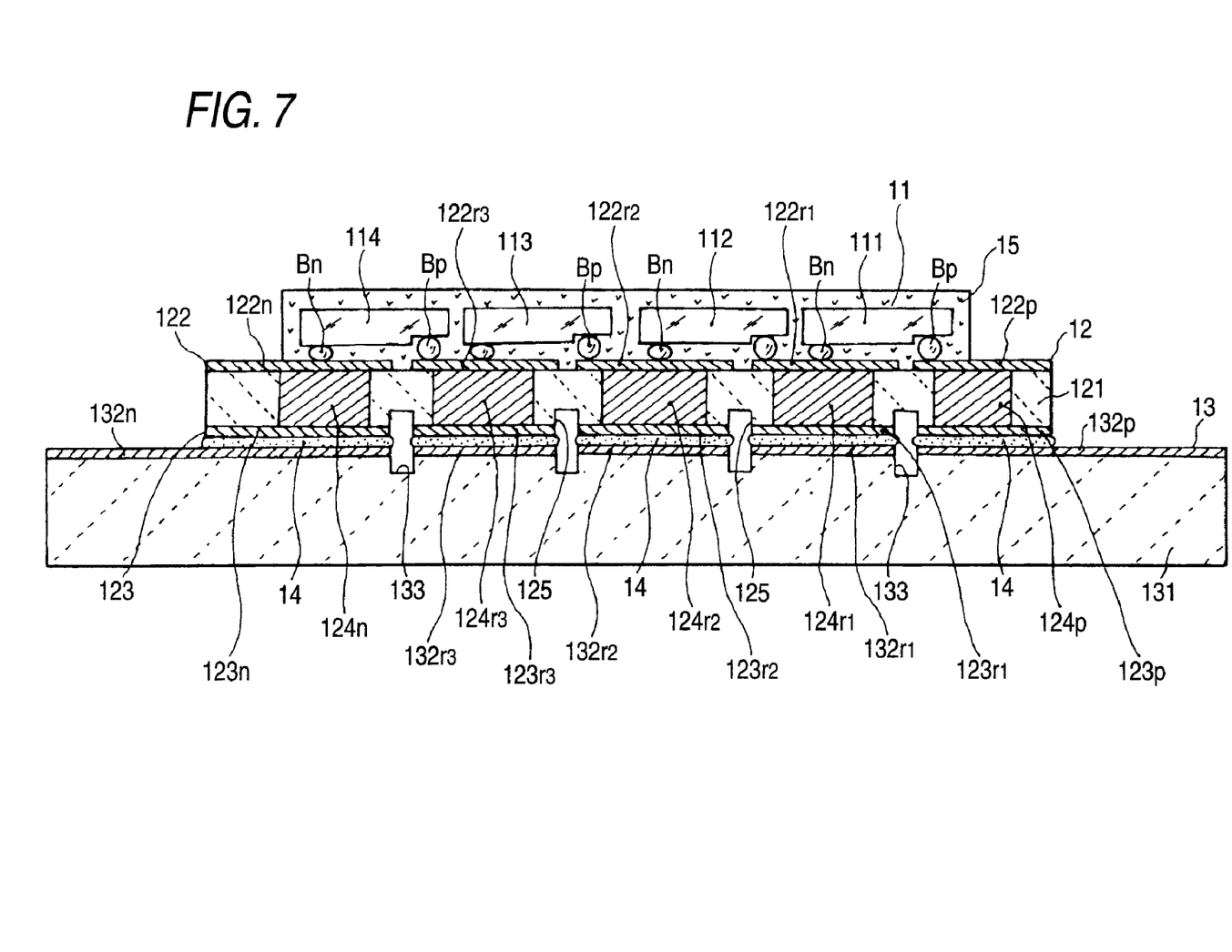
FIG. 7 is a sectional view of the LED module in FIG. 6.
Figure 8A:
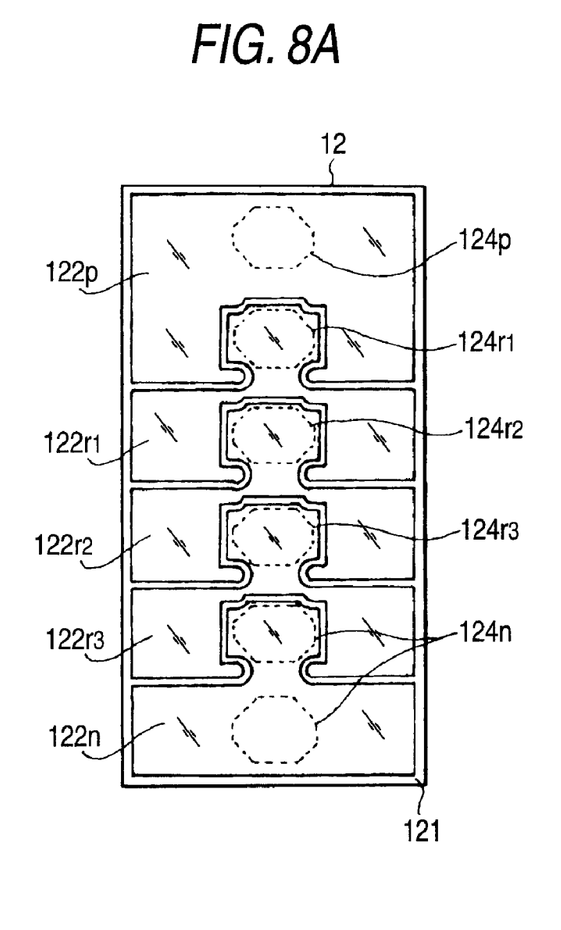
FIGS. 8A and 8B are a front surface view and a back surface view, respectively, of a submount of the LED module in FIG. 7.
Figure 8B:
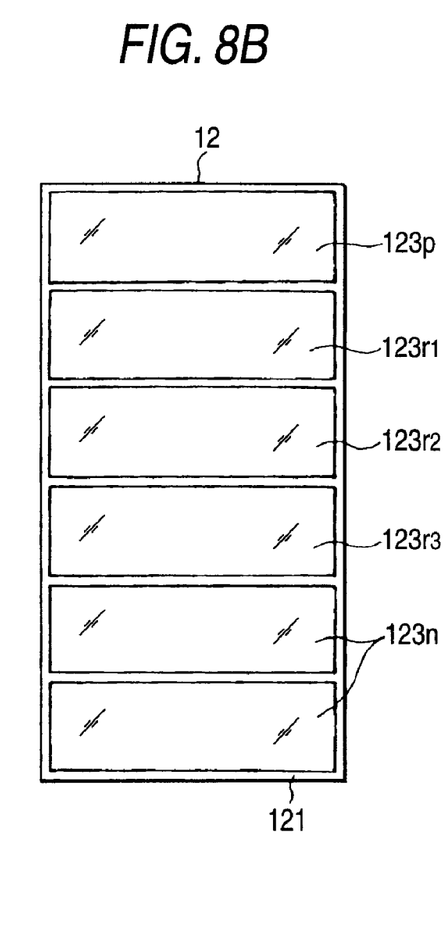

FIG. 6 is a plan view of an LED module 10 according to a second exemplary embodiment of the present invention. In the LED module 10, first to fourth LEDs 111, 112, 113, 114 are used as a light source, and are coupled together in series. FIG. 7 is a sectional view of the LED module 10 according to the second exemplary embodiment. As in FIG. 5, a part of the structure of the LED module 10 is changed in FIG. 7 in order to facilitate illustration. The same reference symbols are affixed to the equivalent portions to those in the first exemplary embodiment. Also, FIGS. 8A and 8B are a front surface view and a back surface view, respectively, of a submount of FIG. 7. In the second exemplary embodiment, the positive and negative surface electrodes 122$p$, 122$n$ are formed on both ends of the substrate 121 as the front surface electrodes 122 on the surface of the submount 12, and then first to third relay surface electrodes 122$r$1, 122$r$2, 122$r$3 are aligned between the positive and negative surface electrodes 122$p$, 122$n$. Also, the back surface electrodes 123 (123$p$, 123$r$1, 123$r$2, 123$r$3, 123$n$) corresponding to the front surface electrodes 122 are formed on the back surface of the submount 12, and a plurality of back surface electrodes 123$p$, 123$r$1, 123$r$2, 123$r$3, 123$n$ are coupled electrically to the corresponding opposing surface electrodes 122$p$, 122$r$1, 122$r$2, 122$r$3, 122$n$ via through electrodes 124 (124$p$, 124$r$1, 124$r$2, 124$r$3, 124$n$) respectively. As shown in FIG. 7 and as indicated by a broken line in FIG. 8A, in place of a plurality of through electrodes 124 described above with reference to the first exemplary embodiment, the through electrodes 124 of the second exemplary embodiment are formed as one thick column-like through electrode respectively in such a manner that through holes each having a relatively large opening diameter are provided in the substrate 121 and then a metal is filled in the through holes as described above with reference to the first exemplary embodiment. The positive back surface electrode 123*p* is coupled to the positive surface electrode 122*p* via the through electrode 124*p*, then the negative back surface electrode 123*n* is coupled to the negative front surface electrode 122*n* via the through electrode 124*n*, and then the first to third relay back surface electrodes 123*r*1, 123*r*2, 123*r*3 are coupled to the first to third relay surface electrodes 122*r*1, 122*r*2, 122*r*3 via the through electrodes 124*r*1, 124*r*2, 124*r*3 respectively. Here, recesses 125 that have a depth equal to or greater than a thickness of the back surface electrodes 123 are formed in areas that are extended along respective boundaries between the back surface electrodes 123*p*, 123*r*1, 123*r*2, 123*r*3, 123*n* on the back surface of the submount 12.

Also, as in the first exemplary embodiment, the high heat-radiant substrate 13 has a structure that the circuit electrodes 132 are formed on the surface of the plate member 131, and therefore only the illustration of the high heat-radiant substrate 13 is omitted. As can be seen from FIG. 6 and FIG. 7, the positive circuit electrode 132*p* and the negative circuit electrode 132*n* are provided on the surface to correspond to the positive and negative back surface electrodes 123*p*, 123*n* of the submount 12. Also, first to third relay circuit electrodes 132*r*1, 132*r*2, 132*r*3 are provided to correspond to the first to third relay back surface electrodes 123*r*1, 123*r*2, 123*r*3 of the submount 12. Here, wirings coupled to an external power source are coupled electrically to the positive and negative circuit electrodes 132*p*, 132*n*. In this case, none of wirings is coupled the first to third relay circuit electrodes 132*r*1, 132*r*2, 132*r*3, and the first to third relay circuit electrodes 132*r*1, 132*r*2, 132*r*3 are set electrically in a floating state and constructed as the first to third dummy circuit electrodes. Also, the recesses 125 that are deeper than a thickness of the circuit electrodes 132 are formed in areas extended along the circuit electrodes 132 on the surface of the high heat-radiant substrate 13. The recesses 133 are arranged to oppose the recesses 125 of the submount 12.

Then, the first to fourth LEDs 111 to 114 each comprising a plate-like chip whose planar shape is similar to a square are mounted on the surface of the submount 12. As in the first exemplary embodiment, each LED has four bump electrodes comprising two positive bump electrodes Bp and two negative bump electrodes Bn. When four bump electrodes are coupled to the neighboring surface electrodes 122 respectively, the first to fourth LEDs 111 to 114 are coupled electrically in series between the positive surface electrode 122*p* and the negative surface electrode 122*n* via the first to third relay surface electrodes 122*r*1, 122*r*2, 122*r*3. Also, as in the first exemplary embodiment, the submount 12 is disposed on the surface of the high heat-radiant substrate 13, and then the back surface electrodes 123 are bonded to the circuit electrodes 132 by the brazing material 14 such as the gold/tin eutectic alloy, or the like. In other words, the positive back surface electrode 123*p* is bonded to the positive circuit electrode 132*p*, the negative back surface electrode 123*n* is bonded to the negative circuit electrode 132*n*, and the first to third relay back surface electrodes 123*r*1, 123*r*2, 123*r*3 are bonded to the relay circuit electrodes 132*r*1, 132*r*2, 132*r*3 as the first to third dummy circuit electrodes respectively. The brazing material 14 that oozes out toward the peripheral portions flows into the recesses 125 on the back surface of the submount 12 and the recesses 133 on the surface of the high heat-radiant substrate 13 in the bonding areas between the back surface electrodes 123 and the circuit electrodes 132. Therefore, the brazing material 14 can be prevented from reaching a neighboring back surface electrode 123 and circuit electrode 132, and the neighboring back surface electrode 123 and circuit electrode 132 can be prevented from becoming short-circuited electrically by the brazing material 14. In particular, in the second exemplary embodiment, since the recesses 125 and the recesses 133 are formed on both the submount 12 and the high heat-radiant substrate 13 respectively, a storage capacity of the brazing material 14 can be enlarged and thus a short circuit caused by the brazing material 14 can be prevented without fail. With this arrangement, an electric power can be fed to the positive back surface electrode 123*p* and the negative back surface electrode 123*n* of the submount 12 from an external power source via the positive circuit electrode 132*p* and the negative circuit electrode 132*n* of the high heat-radiant substrate 13. Also, this electric power can be fed to the positive surface electrode 122*p* and the negative surface electrode 122*n* of the submount 12, and then fed to the first to fourth LEDs 111 to 114 coupled together in series.

The LED light source is constructed by fitting the miniature lens to the LED module 10 as described above in relation to the first exemplary embodiment. Also, as described with respect to the first exemplary embodiment, the LED light source is secured on the upper surface of the heat sink 202 of the LED lamp 2, and also the positive power source wiring and the negative power source wiring extended from the lighting circuit (not shown) are coupled to the positive circuit electrode 132*p* and the negative circuit electrode 132*n* of the high heat-radiant substrate 13. Then, an electric power is fed to the first to fourth LEDs 111 to 114 being coupled together in series when an electric power is fed to the positive circuit electrode 132*p* and the negative circuit electrode 132*n* of the high heat-radiant substrate 13. The light emitted from the LEDs 111 to 114 is converged by the miniature lens 20 and is emergent upward, then is reflected by the reflector 203 to pass through the lens 204, and then is illuminated to have a given light distribution characteristic.

When the first to fourth LEDs 111 to 114 emit light, a part of the heat generated by the first and fourth LEDs 111, 114 is transferred to the positive surface electrode 122*p* and the negative surface electrode 122*n*, and then is transferred to positive back surface electrode 123*p* and the negative back surface electrode 123*n* via the through electrodes 124*p*, 124*n* respectively. The through electrodes 124*p*, 124*n* are formed like a thick column respectively, and therefore heat conductivity, i.e., a heat radiation characteristic, can be increased as compared with that in the first exemplary embodiment. Also, the heat is transferred from positive back surface electrode 123*p* and the negative back surface electrode 123*n* to the positive circuit electrode 132*p* and the negative circuit electrode 132*n* of the high heat-radiant substrate 13 respectively. Therefore, the heat is transferred to the overall high heat-radiant substrate 13 up to the back surface of the high heat-radiant substrate 13, so that the heat is transferred to the heat sink that contacts the high heat-radiant substrate 13 and is radiated. Additionally, a remaining part of the heat generated by the first and fourth LEDs 111, 114 and a part of the heat generated by the second and third LEDs 112, 113 are transferred to the first to third relay surface electrodes 122*r*1, 122*r*2, 122*r*3 of the submount 12, and then to the first to third relay back surface electrodes 123*r*1, 123*r*2, 123*r*3 on the back surface via the through electrodes 124*r*1, 124*r*2, 124*r*3 respectively. In this case, the through electrodes 124*r*1, 124*r*2, 124*r*3 are formed like a thick column respectively, and therefore heat conductivity, i.e., a heat radiation characteristic, can also be increased. The heat transferred to the first to third relay back surface electrodes 123r1, 123r2, 123r3 is transferred to the first to third dummy circuit electrodes 132r1, 132r2, 132r3 of the high heat-radiant substrate 13. Then, the heat is transferred to the overall high heat-radiant substrate 13 including the back surface, so that the heat is transferred to the heat sink 202 and is radiated.

Accordingly, in the second exemplary embodiment, the first to third relay back surface electrodes 123r1, 123r2, 123r3 coupled to the first to third relay surface electrodes 122r1, 122r2, 122r3, which are used to couple the first to fourth LEDs 111 to 114 in series, via the through electrodes 124r1, 124r2, 124r3 respectively are also provided, and the first to third dummy circuit electrodes 132r1, 132r2, 132r3 bonded to the first to third relay back surface electrodes 123r1, 123r2, 123r3 are also provided to the high heat-radiant substrate 13. Therefore, the heat generated by the LEDs 111 to 114 and transferred to the relay surface electrodes 122r1, 122r2, 122r3 respectively can be transferred to the high heat-radiant substrate 13 at a high efficiency via the relay back surface electrodes 123r1, 123r2, 123r3 and the dummy circuit electrodes 132r1, 132r2, 132r3, and the heat can be radiated via the heat sink 202. As a result, the effect of heat radiation can be enhanced.

In the structure of the second exemplary embodiment, the through electrodes 124 that couple electrically the front surface electrodes and the back surface electrodes may be formed like the thick column-like through electrodes. Accordingly, the electric resistance between the front surface electrodes and the back surface electrodes in the second exemplary embodiment can be reduced and also heat transfer efficiency from the front surface electrodes to the back surface electrodes can be enhanced, so that the heat radiation can be further enhanced. Also, in the first and second exemplary embodiments, the through electrodes are not always provided just under the bumps provided to the LEDs, and the through electrodes may be provided in any positions where the front surface electrodes and the back surface electrodes are opposed mutually. Accordingly, when the through electrodes are provided in the area on which the LEDs are mounted, such structure is advantageous in transferring the heat radiated from the LEDs to the back surface electrodes at a higher efficiency.

The recesses 133 are formed on the high heat-radiant substrate 13 in the first exemplary embodiment, and the recesses 125, 133 are formed on both the submount 12 and the high heat-radiant substrate 13 in the second exemplary embodiment. However, alternatively in the second exemplary embodiment, the recesses may be formed only on the submount 12. For example, in FIG. 7, the recesses 133 are not formed on the high heat-radiant substrate 13, but the recesses 125 may be formed only on the back surface of the submount 12. In this case, since the brazing material 14 flows into the recesses 125 even when such brazing material oozes out to the peripheries, a short circuit between the neighboring electrodes can be prevented. Also, in both the first and second exemplary embodiments, the back surface electrodes 123 of the submount 12 are bonded to the circuit electrodes 132 of the high heat-radiant substrate 13 by the brazing material 14. However, in the case when a brazing material is not used in bonding, or when there is no chance that brazing material will ooze out to the peripheries, there is no need to provide the recesses around the back surface electrodes and the circuit electrodes.

According to exemplary embodiments of the present invention, the relay back surface electrodes of the submount are bonded to the circuit electrodes of the high heat-radiant substrate. Accordingly, since the circuit electrodes are floated electrically, the relay back surface electrodes and the relay front surface electrodes coupled to the back surface electrodes via the through electrodes are kept electrically in a floating state, and hence the series connection of the light emitting devices mounted on the front surface electrodes is maintained. Therefore, a part of the heat generated by the light emitting devices is transferred to the circuit electrodes of the high heat-radiant substrate at a high efficiency via the relay front surface electrodes, the through electrodes, the front surface electrodes, and the back surface electrodes, and then the heat is radiated from the high heat-radiant substrate. As a result, an effect of heat radiation of the light emitting devices can be improved.

The light emitting device according to the exemplary embodiments of the present invention is not limited to an LED. The semiconductor light emitting device such as a laser diode, an electroluminescence device, or the like may alternatively be employed. Also, the light emitting device module according to exemplary embodiments of the present invention is not limited to a light source of a vehicle lamp. The light emitting device module is applicable to any light emitting device module which has a relatively high luminous intensity and for which it is advantageous to increase the efficiency of heat radiation.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A light emitting device module comprising:
a plurality of light emitting devices;
a submount on which the plurality of light emitting devices are mounted, the submount comprising:
    a positive front surface electrode;
    a negative front surface electrode;
    at least one relay front surface electrode, wherein the plurality of light emitting devices are electrically coupled to each other in series between the positive front surface electrode and the negative front surface electrode via the at least one relay front surface electrode;
    a plurality of through electrodes;
    a positive back surface electrode coupled to the positive front surface electrode via a through electrode of the plurality of through electrodes;
    a negative back surface electrode coupled to the negative front surface electrode via a through electrode of the plurality of through electrodes; and
    at least one relay back surface electrode, which corresponds to the at least one relay front surface electrode and which is coupled to the at least one relay front surface electrode via a through electrode of the plurality of through electrodes; and
a heat-radiant substrate to which the submount is supported and fixed, the heat-radiant substrate comprising:
    a positive circuit electrode bonded to the positive back surface electrode;
    a negative circuit electrode bonded to the negative back surface electrode; and
    at least one relay circuit electrode bonded to the at least one relay back surface electrode and being floated electrically.

2. The light emitting device module of claim 1, wherein the positive back surface electrode, the negative back surface electrode, and the at least one relay back surface electrode are bonded to the positive circuit electrode, the negative circuit electrode, and the at least one relay circuit electrode, respectively, by a brazing material.

3. The light emitting device module of claim 2, wherein the heat-radiant substrate further comprises a plurality of recesses adapted to insulate and separate the positive circuit electrode, the negative circuit electrode, and the at least one relay circuit electrode from one another.

4. The light emitting device module of claim 2, wherein the submount further comprises a plurality of recesses, the recesses being adapted to insulate and separate the positive back surface electrode, the negative back surface electrode, and the at least one relay back surface electrode from one another.

5. The light emitting device module of claim 3, wherein the submount further comprises a plurality of recesses, the recesses being adapted to insulate and separate the positive back surface electrode, the negative back surface electrode, and the at least one relay back surface electrode from one another.

6. A light emitting device module comprising:
two light emitting devices;
a submount on which the two light emitting devices are mounted, the submount comprising:
two front surface electrodes;
a relay front surface electrode, wherein the light emitting devices are electrically coupled to each other in series between the two front surface electrodes via the relay front surface electrode;
a plurality of through electrodes;
two back surface electrodes, which correspond to the two front surface electrodes, the back surface electrodes being coupled to the respective front surface electrodes by the plurality of through electrodes; and
a relay back surface electrode, which corresponds to the relay front surface electrode and which is coupled to the relay front surface electrode via the plurality of through electrodes; and
a heat-radiant substrate to which the submount is supported and fixed, the heat-radiant substrate comprising:
two circuit electrodes bonded to the two back surface electrodes, respectively; and
a relay circuit electrode bonded to the relay back surface electrode.

7. The light emitting device module according to claim 6, wherein the two surface electrodes and the relay surface electrode are bonded to the two circuit electrodes and the relay circuit electrode, respectively, by a brazing material.

8. The light emitting device module of claim 7, wherein the heat-radiant substrate further comprises two recesses adapted to insulate and separate the two circuit electrodes and the relay circuit electrode from one another.

9. The light emitting device module of claim 7, wherein the submount further comprises two recesses, the recesses being adapted to insulate and separate the two back surface electrodes and the relay back surface electrode from one another.

10. The light emitting device module of claim 8, wherein the submount further comprises two recesses, the recesses being adapted to insulate and separate the two back surface electrodes and the relay back surface electrode from one another.

11. A vehicle headlamp, comprising:
a light emitting device module comprising:
a plurality of light emitting devices;
a submount on which the plurality of light emitting devices are mounted, the submount comprising:
a positive front surface electrode;
a negative front surface electrode;
at least one relay front surface electrode, wherein the plurality of light emitting devices are electrically coupled to each other in series between the positive front surface electrode and the negative front surface electrode via the at least one relay front surface electrode;
a plurality of through electrodes;
a positive back surface electrode coupled to the positive front surface electrode via a through electrode of the plurality of through electrodes;
a negative back surface electrode coupled to the negative front surface electrode via a through electrode of the plurality of through electrodes; and
at least one relay back surface electrode, which corresponds to the at least one relay front surface electrode and which is coupled to the at least one relay front surface electrode via a through electrode of the plurality of through electrodes; and
a heat-radiant substrate to which the submount is supported and fixed, the heat-radiant substrate comprising:
a positive circuit electrode bonded to the positive back surface electrode;
a negative circuit electrode bonded to the negative back surface electrode; and
at least one relay circuit electrode bonded to the at least one relay back surface electrode and being floated electrically.

12. The vehicle headlamp of claim 11, further comprising:
a heat sink on which the light emitting device module is mounted.

13. The vehicle headlamp of claim 12, further comprising:
a reflector supported by the heat sink to forwardly reflect a light emitted from the light emitting device module, wherein the light emitting device module is mounted on a portion of the heat sink corresponding to a focal position of the reflector.

* * * * *